United States Patent [19]

Ikeda

[11] Patent Number: 4,891,608
[45] Date of Patent: Jan. 2, 1990

[54] #6 CONTROL CIRCUIT FOR HORIZONTAL OSCILLATOR
[75] Inventor: Miyuki Ikeda, Yokohama, Japan
[73] Assignee: Hitachi, Ltd., Tokyo, Japan
[21] Appl. No.: 218,649
[22] Filed: Jul. 13, 1988
[30] Foreign Application Priority Data
Jul. 13, 1987 [JP] Japan ................................ 172757/87
[51] Int. Cl.⁴ .......................... H03L 7/08; H04N 5/12
[52] U.S. Cl. ...................................... 331/20; 315/364; 358/159
[58] Field of Search .................. 331/20; 358/158, 159, 358/195.1; 315/364, 399

[56] References Cited
U.S. PATENT DOCUMENTS
4,634,939 1/1987 Dietz .................................... 358/159

Primary Examiner—Siegfried H. Grimm
Attorney, Agent, or Firm—Fay, Sharpe, Beall, Fagan, Minnich & Mckee

[57] ABSTRACT

A horizontal oscillation circuit which prevents damage of horizontal output transistors due to the rapid increase of horizontal deflection current at varying states of horizontal scan frequency or at the turning-on state of the power source. The horizontal oscillation circuit is provided with a speed up circuit which rapidly increases the control voltage supplied to a control voltage terminal of a voltage controlled oscillator. This provides increased speed of the oscillation frequency of the voltage controlled oscillator which does not slow in comparison to increasing speed of power source voltage. Consequently, the horizontal deflection current remains nearly constant, even at varying states of the horizontal scan frequency of the turning-on state of the power source, and damage to horizontal output transistors is avoided.

6 Claims, 2 Drawing Sheets

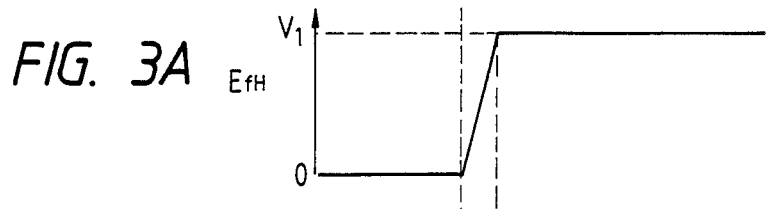
FIG. 3A  $E_{fH}$
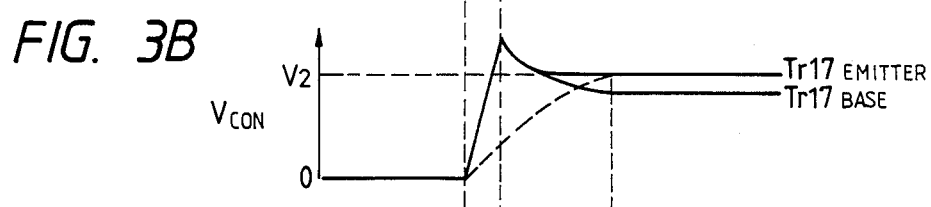
FIG. 3B  $V_{CON}$
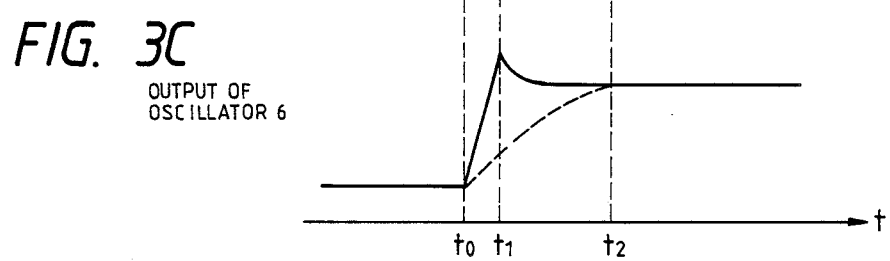
FIG. 3C  OUTPUT OF OSCILLATOR 6
FIG. 4
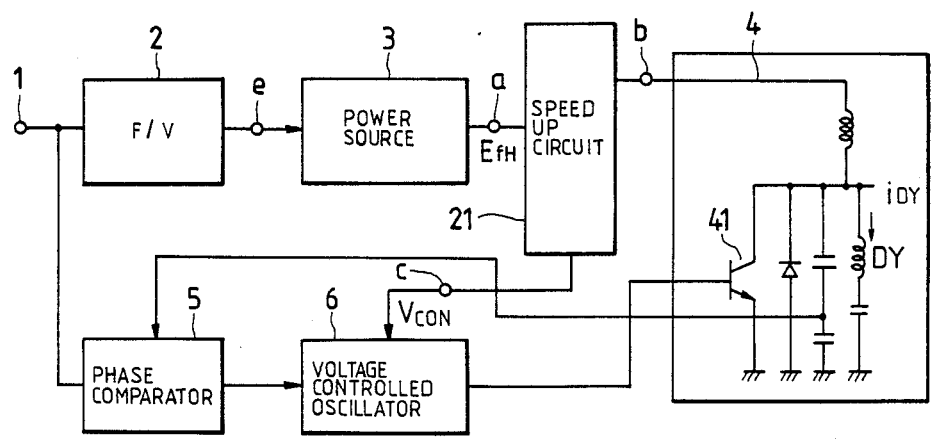

#6 CONTROL CIRCUIT FOR HORIZONTAL OSCILLATOR

BACKGROUND OF THE INVENTION

The present invention relates to horizontal synchronizing oscillation circuits of a display, and more particularly to a horizontal synchronizing oscillation circuit to be used in a display which can reproduce correct images even when image signals having different horizontal scan frequencies are inputted.

In a display corresponding to a plurality of horizontal scan frequencies as shown in the prior art, as disclosed in K. Adachi, et al. Japanese patent publication No. 61-8628 (1986) "Synchronized Oscillator", Published Mar. 15, 1986, DC voltage proportional to frequency of the horizontal synchronizing signal is generated and supplied to a control voltage terminal of a voltage controlled oscillator VCO of a horizontal AFC (automatic frequency control) circuit, thereby free-run frequency of the VCO is controlled and the oscillation output signal having frequency corresponding to the horizontal scan frequency of the input image signal can be obtained.

FIG. 1 shows a horizontal synchronizing oscillation circuit of a display corresponding to a plurality of horizontal scan frequencies in the prior art.

The horizontal synchronizing oscillation circuit in the prior art comprises a terminal 1 to which horizontal synchronizing signal is inputted; an F/V conversion circuit which is connected to the terminal 1 and receives the inputted synchronizing signal and generates voltage corresponding to its frequency; a power source 3 which is connected to the F/V conversion circuit 2 and varies the power source voltage to be supplied to a power source voltage terminal of a horizontal output circuit 4 in response to a signal from the F/V conversion circuit 2, i.e., in response to the frequency of the synchronizing signal; a voltage controlled oscillator (VCO) 6 which supplies drive pulses to a horizontal output transistor 41 of the horizontal output circuit 4; and a phase comparator 5 which receives the synchronizing signal from the terminal 1 and sawtooth wave signal of horizontal period of the horizontal output circuit 4, and detects phase difference between both input signals and supplies the detected signal to a voltage control terminal of the voltage controlled oscillator (VCO) 6.

The horizontal output circuit 4, the phase comparator 5 and the voltage controlled oscillator (VCO) 6 constitute a horizontal AFC circuit.

Output of the power source 3 is applied as power source voltage to the horizontal output circuit 4, and supplied to the voltage control terminal of the voltage controlled oscillator (VCO) 6. In the voltage controlled oscillator (VCO) 6, the power source voltage from the power source 3 and the control voltage from the phase comparator 5 are combined, and frequency of the generated signal is varied in response to the combined control signal.

In the horizontal output circuit 4, peak value $I_{DYpp}$ of the horizontal deflection current flowing in a horizontal deflection coil DY is expressed by following formula.

$$I_{DYpp} = Z \cdot \frac{E_{fH}}{L_{DY}} (T_H - T_r) \quad (1)$$

LDY : inductance of horizontal deflection coil
TH : horizontal period
Tr : horizontal flyback period
EfH : power source voltage of horizontal output circuit 4

From formula (1) it is understood that, in order to have the deflection current flow remain constant throughout the wide horizontal frequency in the horizontal deflection coil DY, the power source voltage EfH must be varied in proportion to the frequency fH (=1/TH) of the horizontal synchronizing signal.

In the circuit of FIG. 1, the frequency of the horizontal synchronizing signal is converted into voltage by the F/V conversion circuit 2, and the power source voltage to be supplied to the power source voltage terminal of the horizontal output circuit 4 is varied in the power source 3 in response to the voltage signal, i.e., in response to the frequency of the horizontal synchronizing signal. In other words, if the frequency of the horizontal synchronizing signal becomes higher, the output of the F/V conversion circuit 2 is increased and the power source voltage $E$fH is increased. Further, the power source voltage $E$fH which varies corresponding to the frequency of the horizontal synchronizing signal is supplied to the voltage control terminal of the voltage controlled oscillator (VCO) 6, and free-run frequency of the voltage controlled oscillator (VCO) 6 is varied, thereby the horizontal AFC circuit is synchronized with the horizontal synchronizing signal in the wide horizontal deflection frequency range.

In the horizontal oscillation circuit of the prior art, however, when the power source is turned on or off, or when the horizontal scan frequency is changed, the output transistor 41 may be damaged. The damage may occur if the increase of the oscillation frequency $f_H$, of the VCO 6 cannot follow the rapid increase of the power source voltage $E_{fH}$, and the decrease of the effective scan period $\Delta(T_H - T_r) \approx 1/\Delta f_H'$ in the horizontal direction becomes extremely small in comparison to the increase of the variation $\Delta E_{fH}$ of the power source voltage $E_{fH}$ in formula (1). This causes the deflection current $I_{DY}$, determined in proportion to product of $(T_H-T_r)$, and the power source voltage EfH, to become abnormally large and as a result the output transistor 41 may be damaged.

SUMMARY OF THE INVENTION

An object of the invention is to provide a horizontal oscillation circuit wherein the horizontal output transistor would not be damaged even when power source voltage of the horizontal output circuit rises at the increasing state of the horizontal scan frequency or at the turning-on state of the power source.

In order that the increased speed of oscillation frequency of the voltage controlled oscillator does not become slow in comparison to increased speed of the power source voltage $E_{fH}$, the horizontal oscillation circuit of the invention is provided with a speed up circuit which detects the rapid increase of the power source voltage, and in response rapidly increases the control voltage to be supplied to the control voltage terminal of the voltage controlled oscillator. Consequently, the horizontal deflection current $I_{DY}$ becomes nearly always constant even at varying states of the horizontal scan frequency, or at the turning-on state of the power source, thereby keeping the horizontal output transistor from being damaged.

BRIEF DESCRIPTION OF THE DRAWINGS

FIGS. 3A, 3B, and 3C illustrate operating waveforms in the horizontal oscillation circuit in the embodiment of the invention; and FIG. 4 is a circuit diagram of the horizontal oscillation circuit and a peripheral circuit in the embodiment of the invention.

DESCRIPTION OF THE PREFERRED EMBODIMENTS

A horizontal synchronizing oscillation circuit as a preferred embodiment of the invention is provided with a speed up circuit 7 between a power source circuit 3, a horizontal output circuit 4 and a voltage controlled oscillator 6 as shown in FIG. 4. The speed up circuit 7 is a circuit which rapidly increases the control voltage to be supplied to a control voltage terminal of the voltage controlled oscillator 6 corresponding to the increase (rise) of the power source voltage $E_{fH}$.

Figure 1:
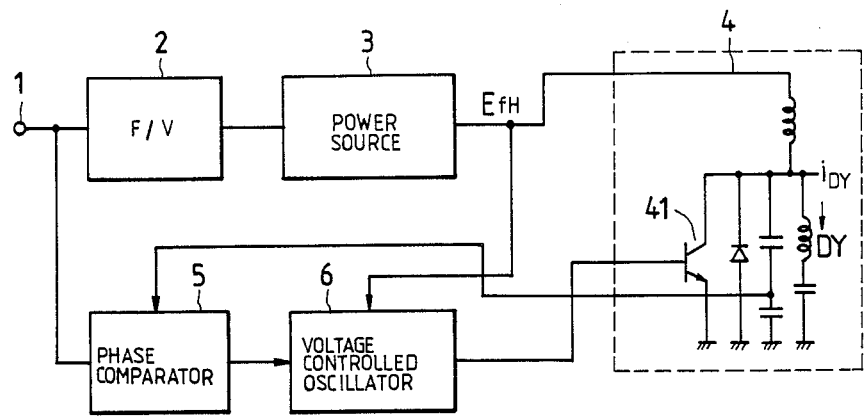
FIG. 1 is a circuit diagram of a horizontal oscillation circuit and a horizontal output circuit of the prior art.
Figure 2:
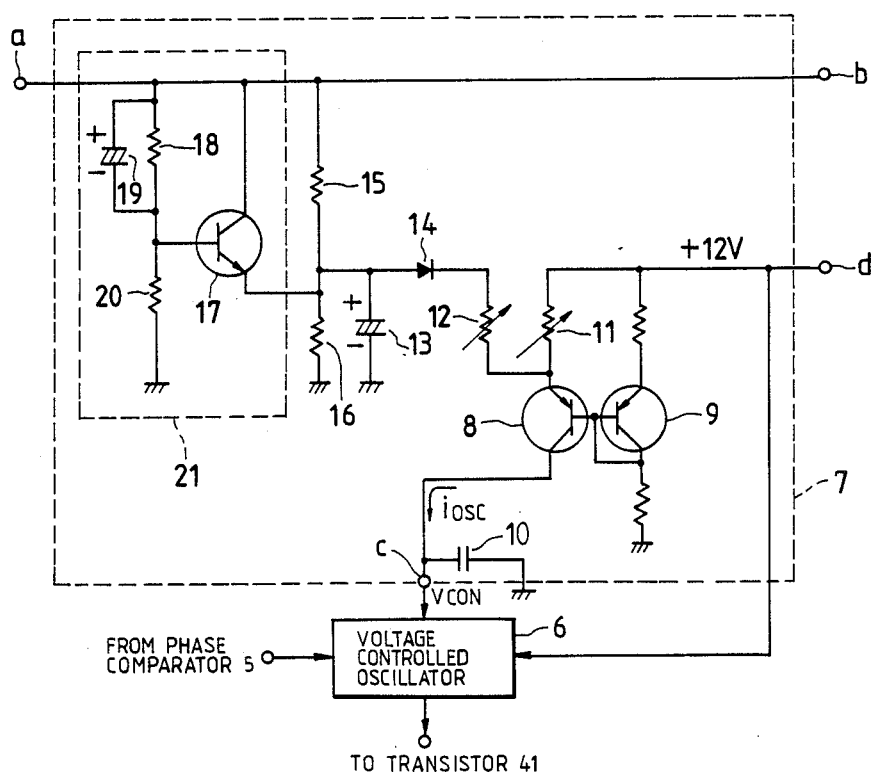
FIG. 2 is a circuit diagram of a speed up circuit to be used in a horizontal oscillation circuit in an embodiment of the invention.

A specific circuit of the speed up circuit 7 is shown in FIG. 2. Terminals a, b, c in FIG. 2 are connected respectively to terminals a, b, c in FIG. 4. Terminal d is a power source terminal.

The speed up circuit 7 comprises a speed up capacitor 19, bleeder resistors 15, 16, 18, 20, an emitter follower transistor 17, a ripple removing capacitor 13, a diode 14, voltage/current conversion transistors 8, 9, a capacitor 10 holding the control voltage to be supplied to the control voltage terminal of the VCO 6, and an oscillation frequency adjusting variable resistors 11, 12.

The terminal a is supplied with the power source voltage $E_{fH}$ which is varied corresponding to frequency of the horizontal synchronizing signal from the power source of circuit 3.

Operation of the circuit will now be described.

Base voltage $V_B$ of the emitter follower transistor 17 given by dividing the power source voltage $E_{fH}$ by the bleeder resistors 18, 20 is set slightly lower than voltage given by dividing the power source voltage $E_{fH}$ by the bleeder resistors 15, 16. As a result, the emitter follower transistor 17 is usually cut off. Consequently, the circuit enclosed by the dotted line in FIG. 2 is usually equivalent to nothing. Assuming that the circuit, including the emitter follower transistor 17, enclosed by dotted line does not exist, if the power source is turned on or the horizontal scan frequency is made high, thereby rapidly increasing the power source voltage $E_{fH}$, the response is delayed by the time of charging the ripple removing capacitor 13. In the invention, however, when the power source is turned on or the horizontal scan frequency is made high, the bleeder resistor 18 is bypassed by the speed-up capacitor 19 at the rising state of the voltage, and since the emitter follower transistor 17 is turned on, voltage higher than that given by dividing the power source voltage $E_{fH}$ by the bleeder resistors 15, 16 is applied to the ripple removing capacitor 13 through the emitter follower transistor 17. This causes the ripple removing capacitor 13 to be rapidly charged, and the control voltage can be applied rapidly to the VCO through the transistors 8, 9. Consequently, the time difference between the increasing state of the power source voltage $E_{fH}$ and the rising state of the control voltage is eliminated, and damage to the horizontal output transistor due to the rapid increase of the deflection current $I_{DY}$ is not produced.

The operation will be described further in detail using the waveforms in FIGS. 3A, 3B, and 3C.

FIGS. 3A, 3B, and 3C show what happens when the power source voltage $E_{fh}$ is rapidly increased at the turning-on state of the power source. Before the time $t_o$, the ripple removing capacitor 13 and the speed-up capacitor 19 are not charged.

If the power is turned on at the time $t_o$, the power source voltage $E_{fH}$ is rapidly increased as shown in FIG. 3A, and becomes $V_1$ at the time t1. Then the control voltage $V_{con}$ of the VCO 6 is increased from 0 volt to $V_2$ volt as shown in FIG. 3B. In this case, signal shown by broken line in FIG. 3B is the control voltage $V_{con}$ in a conventional circuit, that is, when the circuit enclosed by dotted line, including the emitter follower transistor 17 in FIG. 2 does not exist, and lapse to the time $t_2$ is required in order that the control voltage $V_{con}$ attains to $V_2$ volt. This is because the response is delayed by the time of charging the ripple removing capacitor 13 as described above. On the contrary, in the circuit of the embodiment, the control voltage $V_{con}$ becomes $V_2$ at the time $t_1$ according to the action of the speed up circuit.

When the oscillation frequency of the VCO is varied as shown in FIG. 3C. Comparing FIG. 3C with FIG. 3A, it is understood that the VCO oscillation frequency in the oscillation circuit of the invention rises without substantial delaying to the rising of the power source voltage $E_{fH}$. After the VCO control voltage rises sufficiently, the speed-up capacitor 19 is sufficiently charged and the emitter follower transistor 17 is cut off, the voltage by dividing the power source voltage $E_{fH}$ by the bleeder resistors 15, 16 is continuously applied as the control voltage to the VCO.

Although the speed up circuit direclty detects variation of the power source voltage $E_{fH}$ in the above description, and since the power source voltage $E_{fH}$ is proportional to output of the F/V conversion circuit 2, detection of variation of the power source voltage $E_{fH}$ may be replaced by detection of variation of the output of the F/V conversion circuit 2. In this case, the terminals a, b in the speed up circuit in FIG. 4 are separated, and the terminal a is connected to the contact e of FIG. 4, and the output terminal a at the side of the power source 3 in FIG. 4 and the power source terminal b of the horizontal output circuit 4 are directly connected. In this case, constant of each element in the speed up circuit shown in FIG. 2 must be varied corresponding to differences between the output level of the F/V conversion circuit 2 and the level of the power source voltage $E_{fH}$.

I claim:

1. A control circuit for a horizontal oscillator wherein horizontal synchronizing signals having different horizontal scan frequencies are inputted, and signals for driving a horizontal output circuit are generated in synchronization with the horizontal synchronizing signals, the control circuit for the horizontal oscillator comprising:

a frequency-to-voltage (F/V) converter for receiving the horizontal synchronizing signals and for generating an output voltage corresponding to the frequency of said horizontal synchronizing signals;

a power source means connected to said F/V converter for supplying a power source voltage corresponding to said output voltage of said F/V converter to a power source voltage terminal of the horizontal output circuit;

a phase comparing means for detecting phase difference between said horizontal synchronizing signals and a sawtooth wave of horizontal period produced by the horizontal output circuit;

a voltage controlled oscillation means for receiving an output of said phase comparing means, for generating horizontal drive pulses having a frequency corresponding to a control voltage supplied to a control voltage terminal thereof, and for supplying said horizontal drive pulses to the horizontal output circuit; and a speed-up circuit, which has an output end terminal connected to said control voltage terminal of said voltage controlled oscillation means, for decreasing the rise time of said control voltage in response to detection of rapid increase of said power source voltage.

2. A control circuit as set forth in claim 1, wherein said speed-up circuit is connected to the output end of said power source circuit, and rapid increases of the power source voltage are detected from the variation of voltage at the output end.

3. A control circuit as set forth in claim 1, wherein said speed-up circuit detects rapid increases of the power source voltage from the variation of output of said F/V converter.

4. A control circuit as set forth in claim 1, wherein said speed-up circuit supplies charging current, larger than at normal operation state, to a ripple removing capacitor connected between the control voltage terminal of said voltage controlled oscillation means and the output of said power source means at rapidly increasing states of the power source voltage.

5. A control circuit as set forth in claim 4, wherein said speed-up circuit comprises a first resistance type potential divider for applying the power source voltage to said ripple removing capacitor at normal operation state, an emitter follower transistor connected to said ripple removing capacitor, a second resistance type potential divider connected to the base of said emitter follower transistor, and a speed-up capacitor connected between the base of said emitter follower transistor and the output of said power source means.

6. A control circuit as set forth in claim 5, wherein the dividing voltage of said second resistance type potential divider is set lower than that of said first resistance type potential divider.

* * * * *